(12) United States Patent　(10) Patent No.: US 7,989,240 B2
Choi　(45) Date of Patent: Aug. 2, 2011

(54) METHODS OF MANUFACTURING ACTIVE MATRIX SUBSTRATE AND ORGANIC LIGHT-EMITTING DISPLAY DEVICE

(75) Inventor: Woong-Sik Choi, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/695,933

(22) Filed: Jan. 28, 2010

(65) Prior Publication Data

US 2010/0255617 A1　Oct. 7, 2010

(30) Foreign Application Priority Data

Apr. 6, 2009　(KR) .................. 10-2009-0029560

(51) Int. Cl.
*H01L 21/00*　(2006.01)
*H01L 21/84*　(2006.01)

(52) U.S. Cl. ............ 438/29; 438/22; 438/23; 438/82; 438/99; 438/149; 257/E21.32; 257/E21.372; 257/E27.112; 257/E51.005

(58) Field of Classification Search .......... 438/22, 438/23, 29, 82, 99, 149; 257/E21.32, E21.372, 257/E27.112, E51.005
See application file for complete search history.

(56) References Cited

U.S. PATENT DOCUMENTS

| | | | |
|---|---|---|---|
| 2001/0005598 A1* | 6/2001 | Powell | 438/30 |
| 2004/0229444 A1 | 11/2004 | Couillard et al. | |
| 2005/0255670 A1* | 11/2005 | Couillard et al. | 438/455 |
| 2005/0266658 A1* | 12/2005 | Couillard et al. | 438/455 |
| 2005/0285108 A1* | 12/2005 | Choi | 257/59 |
| 2006/0234477 A1* | 10/2006 | Gadkaree | 438/478 |
| 2007/0048968 A1* | 3/2007 | Couillard et al. | 438/455 |
| 2007/0117354 A1* | 5/2007 | Gadkaree et al. | 438/478 |
| 2007/0141802 A1* | 6/2007 | Gadkaree | 438/455 |
| 2007/0249139 A1* | 10/2007 | Gadkaree et al. | 438/458 |
| 2007/0277874 A1* | 12/2007 | Dawson-Elli et al. | 136/256 |
| 2009/0189148 A1* | 7/2009 | Araumi et al. | 257/40 |
| 2009/0294853 A1* | 12/2009 | Fenger et al. | 257/347 |

* cited by examiner

*Primary Examiner* — Alexander G Ghyka
*Assistant Examiner* — Leonard Chang
(74) *Attorney, Agent, or Firm* — Christie, Parker & Hale, LLP

(57) ABSTRACT

A method of manufacturing an active matrix substrate that enables increased productivity due to a reduction in the number of patterning processes and low generation of particles during the patterning processes. The method includes forming a patterned electrode on a substrate, and covering the first electrode with an insulating film. A mono-crystalline semiconductor layer is then formed on the insulating film by attaching a first layer formed on a surface of a semiconductor wafer to the first insulating film, and peeling off a portion of the semiconductor wafer. The semiconductor layer is then patterned and doped, in part, by utilizing the patterned electrode as a photo mask for light illuminated from a lower side of the substrate. This results in part in mono-crystalline active layers for thin film transistors, which are then configured to form a pixel for an active matrix substrate.

16 Claims, 4 Drawing Sheets

METHODS OF MANUFACTURING ACTIVE MATRIX SUBSTRATE AND ORGANIC LIGHT-EMITTING DISPLAY DEVICE

CROSS-REFERENCE TO RELATED PATENT APPLICATION

This application claims priority to and the benefit of Korean Patent Application No. 10-2009-0029560, filed on Apr. 6, 2009, in the Korean Intellectual Property Office, the entire content of which is incorporated herein by reference.

BACKGROUND

1. Field

The following description relates to methods of manufacturing an active matrix substrate and an organic light emitting display device.

2. Description of the Related Art

Recent flat panel display devices are driven by an active matrix method, where a light emitting device is formed on an active matrix substrate that includes a plurality of thin-film transistors. In particular, an organic light emitting display device uses a thin-film transistor formed with a poly-silicon material. When a low-temperature crystallization method is used for forming a poly-silicon film, the process of manufacturing of the flat panel display devices is very complicated, and thus, productivity is reduced.

That is, in order to form the active matrix substrate, a plurality of patterning processes, which use a photolithography process, are used. In this case, photo masks corresponding to desired patterns are used in each of the patterning processes.

Accordingly, manufacturing costs are increased due to the large amount of equipment used for performing the photolithography processes, and an overall process time is increased due to the photolithography processes, thereby reducing productivity.

Also, a low-yield production is caused due to particles generated during various processes.

SUMMARY

Aspects of embodiments of the invention are directed toward a method of manufacturing an active matrix substrate that increases productivity by reducing a number of patterning processes and reducing the likelihood of a low-yield production, and a method of manufacturing an organic light emitting display device.

According to an embodiment of the present invention, a method of manufacturing an active matrix substrate includes forming a first electrode in a first pattern on a substrate; forming a first insulating film to cover the first electrode on the substrate; attaching a first layer on a surface of a semiconductor wafer to the first insulating film by placing the semiconductor wafer on the first insulating film; transferring the first layer onto the first insulating film to form a semiconductor layer on the first insulating film; doping a portion of the semiconductor layer with a dopant and patterning the semiconductor layer to form an active layer; forming a second insulating film to cover the active layer on the first insulating film; and forming a second electrode coupled to the doped region of the active layer on the second insulating film.

In some embodiments, the doping of the portion of the semiconductor layer with the dopant and the patterning of the semiconductor layer to form the active layer includes forming a first resist layer on the semiconductor layer to cover a first portion of the semiconductor layer and to expose a first region of the semiconductor layer through an opening in the first resist layer; doping the first region of the semiconductor layer with a dopant through the opening in the first resist layer; removing the first resist layer; and patterning the semiconductor layer to a second pattern to form the active layer.

Forming the first layer on the surface of the semiconductor wafer may include ion implanting a gas that includes hydrogen ions into a surface of the semiconductor wafer.

The semiconductor wafer may be formed of mono-crystalline silicon.

The pattern of the opening in the first resist layer may be substantially identical to a pattern in which portions other than portions of the first resist layer corresponding to the first pattern of the first electrode are etched.

The forming of the first resist layer may include exposing the first resist layer to light from a lower side of the substrate in accordance with the pattern of the first electrode; and etching the first resist layer so as to maintain portions of the first resist layer substantially corresponding in position to the pattern of the first electrode.

The patterning of the semiconductor layer into the second pattern may be performed prior to the forming of the first resist layer.

In one embodiment, a method of manufacturing an organic light emitting display device includes forming a first gate electrode and a second gate electrode on a substrate; forming a first insulating film to cover the first and second gate electrodes on the substrate; attaching a first layer on a surface of a semiconductor layer to the first insulating film by placing the semiconductor wafer on the first insulating film; transferring the first layer onto the first insulating film to form a semiconductor layer on the first insulating film ; doping the first and second regions of the semiconductor layer and patterning the semiconductor layer to form a first active layer having a first region and a second active layer having a second region, wherein at least the first region and the second region are doped with the same type of dopant; forming a second insulating film to cover the first and second active layers on the first insulating film; forming holes in the second insulating film to expose the first and second regions of the semiconductor layer; forming a second electrode coupled (e.g., conductively coupled) to the first region and the second region and forming a pixel electrode coupled (e.g., conductively coupled) to the second region on the second insulating film; forming a third insulating film to cover the second electrode and the pixel electrode on the second insulating film; forming an opening in the third insulating film to expose at least one portion of the pixel electrode; forming an organic film that includes a light emitting layer on the at least one portion of the pixel electrode exposed through the opening in the third insulating film; and forming a facing electrode to cover the organic film.

The forming of the first and second active layers may include forming a first resist layer on the semiconductor layer to cover the semiconductor layer and having an opening to expose the first region and the second region of the semiconductor layer; doping the first region and the second region of the semiconductor layer with a dopant through the opening of the first resist layer; removing the first resist layer; and patterning the semiconductor layer into a second pattern to form the first and second active layers.

The forming of the first layer may include ion implanting a gas that includes hydrogen ions into a surface of the semiconductor wafer.

The semiconductor wafer may be formed of mono-crystalline silicon.

The pattern of the opening in the first resist layer may be substantially identical to a pattern in which portions other than portions of the first resist layer corresponding to the pattern of the first electrode are etched.

The forming of the first resist layer may include exposing the first resist layer to light from a lower side of the substrate in accordance with a pattern of the first gate electrode and the second gate electrode; and etching the first resist layer so as to maintain portions of the first resist layer to substantially correspond in position to the pattern of first gate electrode and the second gate electrode.

The patterning of the semiconductor layer into the second pattern may be performed prior to the forming of the first resist layer.

According to aspects of various embodiments of the present invention, in manufacturing an organic light emitting display device, an active matrix substrate, which is a base substrate, is simply patterned using a small number of photo masks, thereby reducing manufacturing costs and increasing yield.

Also, a further improved circuit can be realized since the semiconductor layer of the thin-film transistor can be formed of a mono-crystalline semiconductor material.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
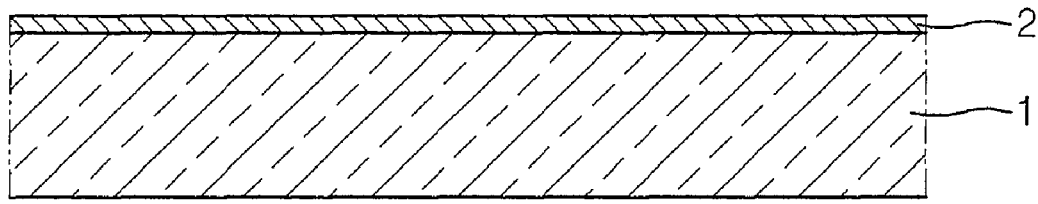
FIG. 1 is a schematic cross-sectional view of a first conductive film formed on a substrate according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

FIGS. 1 through 11 are schematic cross-sectional views that illustrate methods of manufacturing an active matrix substrate and an organic light emitting display device, according to embodiments of the present invention.

Referring to FIG. 1, a first conductive film 2 is formed on a substrate 1. The substrate 1 may be formed of a transparent glass material, and conventionally includes alkali-earth ions. A buffer layer that is formed mainly of $SiO_2$ may further be formed on the substrate 1.

The first conductive film 2 may be formed of a highly conductive metal used to form an electrode, for example, an alloy that includes Al, Ti, Mo, Ag, and/or Cr.

Figure 2:
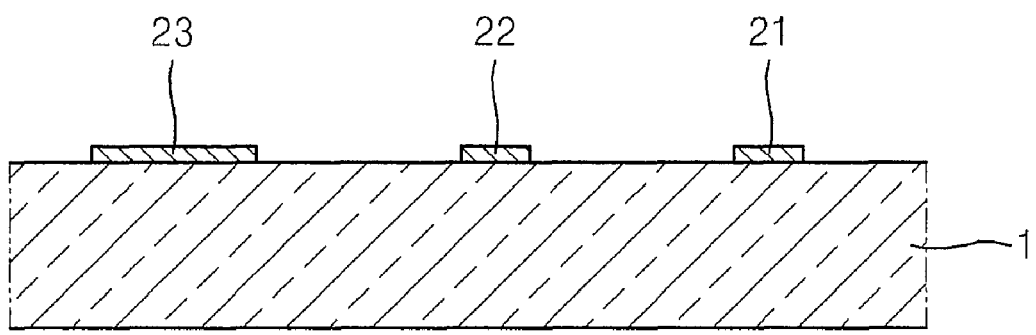
FIG. 2 is a schematic cross-sectional view of a first pattern of the first conductive film of FIG. 1.

The first conductive film 2 is patterned to a first pattern as shown in FIG. 2 by a photolithography process using a first photo mask. The photolithography process may be any suitable photolithography process. That is, after forming a first photoresist film on the first conductive film 2, the first photoresist film is exposed through the first photo mask, and the first conductive film 2 is patterned to the first pattern as shown in FIG. 2 through a development process and an etching process, and then, the first photoresist film remaining on the first conductive film 2 is removed.

The first pattern includes a first gate electrode 21, a second gate electrode 22, and a capacitor lower electrode 23 as signal wires.

Figure 3:
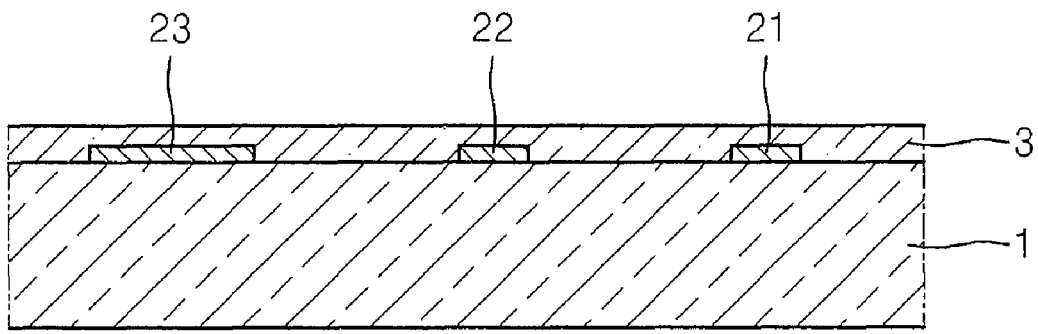
FIG. 3 is a schematic cross-sectional view of a first insulating film formed on a substrate of FIG. 2.

Next, referring to FIG. 3, a first insulating film 3, covering the first pattern that includes the first gate electrode 21, the second gate electrode 22, and the capacitor lower electrode 23, is formed on the substrate 1. The first insulating film 3 may be formed as an optically transparent insulating film, and may be formed of an oxide material that includes alkali ions and/or alkali-earth ions, for example, a silica group.

A semiconductor film is formed on the first insulating film 3.

According to an embodiment of the present invention, the semiconductor film is formed using a semiconductor layer transfer printing method disclosed in U.S. Patent Publication No. US2004/0229444, the entire content of which is incorporated herein by reference.

Figure 4:
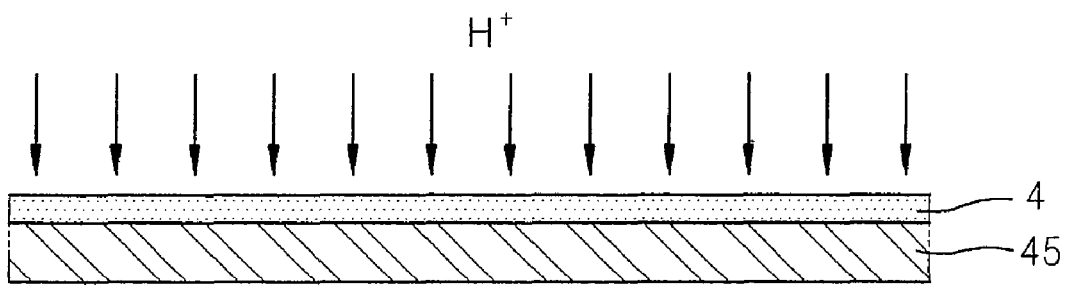
FIG. 4 is a schematic cross-sectional view showing ion implantation to a semiconductor wafer.

That is, referring to FIG. 4, after preparing a semiconductor wafer 45, a surface of the semiconductor wafer 45 is implanted with ions. The semiconductor wafer 45 may be a mono-crystalline silicon wafer, but is not limited thereto, and may be a mono-crystalline wafer formed of a semiconductor material such as SiGe, SiC, Ge, GaAs, GaP, InP, or the like.

The ion implanting may be performed using hydrogen ions, but is not limited thereto, and may be performed using a mixture of boron ions and hydrogen ions or a mixture of helium ions and hydrogen ions.

As a result of the ion implanting, a semiconductor layer 4, which is a weakened region, is formed on a surface of the semiconductor wafer 45.

The semiconductor layer 4 formed in this way is oxidized after a washing process. The oxidization treatment may be an oxygen plasma treatment, a hydrogen peroxide treatment, a hydrogen peroxide and ammonia treatment, or a hydrogen peroxide and acid treatment. As a result of the oxidization treatment, hydroxyl groups are formed on the surface of the semiconductor layer 4, and the surface of the semiconductor layer 4 becomes hydrophilic.

Figure 5:
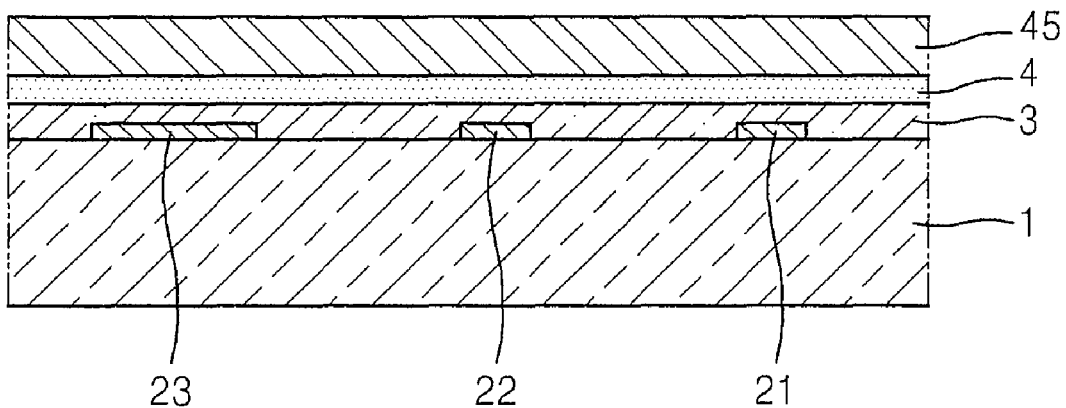
FIG. 5 is a schematic cross-sectional view showing the semiconductor wafer of FIG. 4 attached to the first insulating film of FIG. 3.

Next, referring to FIG. 5, the semiconductor wafer 45 is placed on the first insulating film 3 so that the semiconductor layer 4 contacts the first insulating film 3 and is between the semiconductor wafer 45 and the first insulating film 3. Here, according to one embodiment, the surface of the first insulating film 3 is washed and planarized before the semiconductor wafer 45 is placed on the first insulating film 3.

Next, the semiconductor layer 4 and the first insulating film 3 are attached to each other using an electrolysis method as described below in more detail.

First, both the semiconductor layer 4 and the first insulating film 3 are heated to different temperatures from each other before the semiconductor layer 4 and the first insulating film 3 are attached. The temperature difference is maintained to match the thermal expansion coefficients of the semiconductor layer 4 and the first insulating film 3, and thus, to separate (or peel off) the semiconductor layer 4 from the semiconductor wafer 45 in a subsequent process due to the thermal stress between the semiconductor layer 4 and the semiconductor wafer 45. In some embodiments, the temperature difference is between 100 to 150° C. (or between about 100 and about 150° C.).

Next, the semiconductor layer 4 and the first insulating film 3 are respectively maintained at uniform temperatures while compressing the semiconductor layer 4 against the first insulating film 3. Afterwards, a voltage is applied to the semiconductor layer 4 and the first insulating film 3, for example, using the semiconductor layer 4 as an anode and the first insulating film 3 as a cathode.

Due to the application of a voltage, alkali ions and/or alkali-earth ions present at an interface between the first insulating film 3 and the semiconductor layer 4 are moved to the first insulating film 3. As a result, an alkali ion-free region and/or an alkali-earth ion-free region is present at the interface between the first insulating film 3 and the semiconductor layer 4, and thus, the first insulating film 3 and the semiconductor layer 4 are more strongly attached.

After the processes of compression and application of a voltage are maintained for a period of time (e.g., a predetermined period of time), the assembled structure is cooled at room temperature. Then, the semiconductor wafer 45 separates from the semiconductor layer 4 due to the thermal stress between the semiconductor layer 4 and the semiconductor wafer 45.

Figure 6:
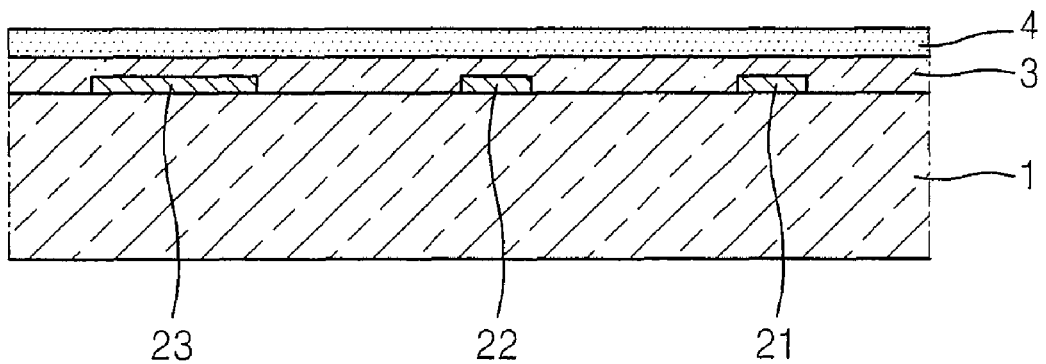
FIG. 6 is a schematic cross-sectional view of a semiconductor layer formed on the first insulating film by peeling the semiconductor wafer of FIG. 5 from the semiconductor layer.

Referring to FIG. 6, the semiconductor wafer 45 separates from the semiconductor layer 4 using a peeling process. Here, the semiconductor layer 4 remains attached to the first insulating film 3.

After the semiconductor layer 4 is formed as described above, the semiconductor layer 4 may be maintained at a substantially uniform thickness through a surface washing process and an etching process.

The method of forming the semiconductor layer 4 according to the present invention is not limited to the disclosed embodiments, and the semiconductor layer may be formed, for example, by depositing amorphous silicon on the first insulating film 3.

Figure 7:
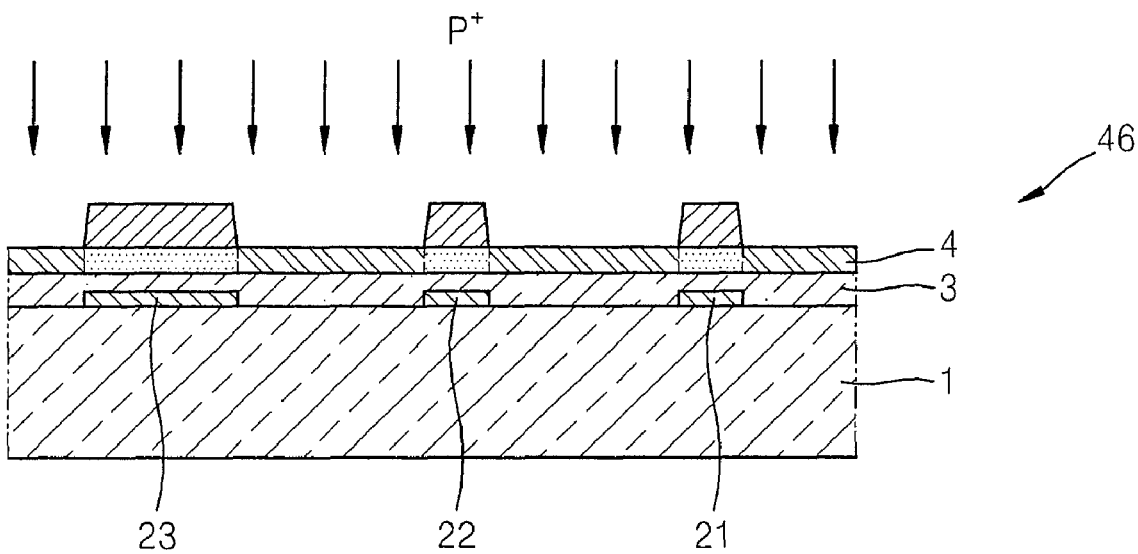
FIG. 7 is a schematic cross-sectional view showing a state in which the semiconductor layer is doped with a dopant after forming a second photoresist film on the semiconductor layer.

Referring to FIG. 7, after coating a second photoresist film 46 on the semiconductor layer 4, the second photoresist film 46 is patterned into a second pattern.

Here, the patterning of the second photoresist film 46 into the second pattern is performed using not an additional photo mask but the first pattern, that is, the pattern of the first gate electrode 21, the second gate electrode 22, and the capacitor lower electrode 23 by irradiating light toward the second resist film 46 from a lower side of the substrate 1. That is, when light is irradiated from the lower side of the substrate 1, regions of the second photoresist film 46 where the light is substantially blocked by the first conductive film 2 of the first pattern, that is, by the first gate electrode 21, the second gate electrode 22, and the capacitor lower electrode 23, have a different degree of hardening from regions of the second photoresist film 46 where the light passes, and thus, the second pattern as shown in FIG. 7 is obtained when the second photoresist film 46 is etched. In the second pattern of FIG. 7, the second photoresist film 46 remains on the semiconductor layer 4 in regions corresponding to upper parts of the first conductive film 2 of the first pattern, that is, the first gate electrode 21, the second gate electrode 22, and the capacitor lower electrode 23, and the other regions of the semiconductor layer 4 are exposed.

At this state, the exposed regions of the semiconductor layer 4 are doped with p+ ions. The p+ ions may be any dopant that can form an active layer in a p-type metal-oxide semiconductor (PMOS) thin-film transistor, for example, $B_2H_6$ ions.

Figure 8:
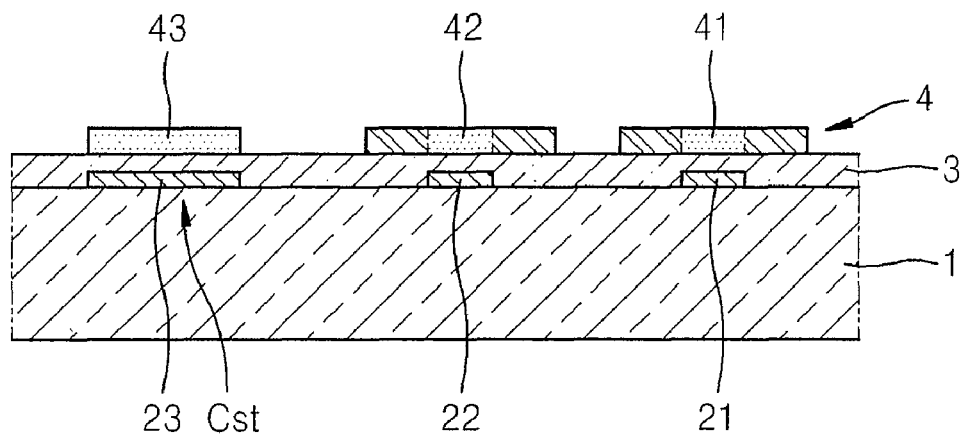
FIG. 8 is a schematic cross-sectional view of a patterned semiconductor layer.

Next, referring to FIG. 8, after removing the second photoresist film 46, the semiconductor layer 4 is patterned. Here, the photolithography process may be any suitable photolithography process.

That is, after removing the second photoresist film 46, a third photoresist film is coated on the semiconductor layer 4. Next, set or predetermined regions of the semiconductor layer 4 are exposed by irradiating light thereon through a second photo mask and developing the third photoresist film. After etching the exposed semiconductor layer 4, remaining portions of the third photoresist film are removed. Thus, the semiconductor layer 4 having a third pattern as shown in FIG. 8 is obtained.

The third pattern includes a capacitor upper electrode 43, a first active layer 41, and a second active layer 42.

The capacitor upper electrode 43 is formed above the capacitor lower electrode 23, and is patterned to correspond to the capacitor lower electrode 23 to form a storage capacitor Cst. The first active layer 41 and the second active layer 42 are respectively active layer patterns in thin-film transistors.

Figure 9:
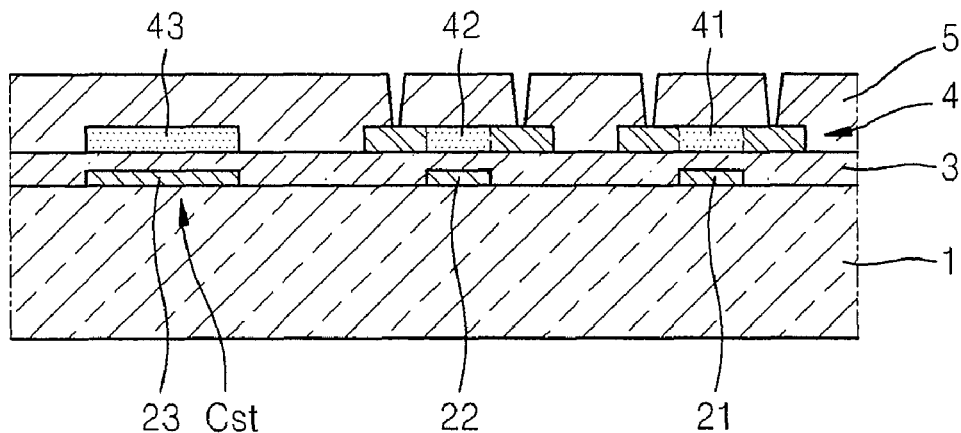
FIG. 9 is a schematic cross-sectional view of a second insulating film covering the patterned semiconductor layer of FIG. 8.

Next, referring to FIG. 9, a second insulating film 5, covering the capacitor upper electrode 43, the first active layer 41, and the second active layer 42, is formed on the first insulating film 3.

The second insulating film 5 is patterned using a photolithography process to form contact holes through which source/drain regions of the first active layer 41 and the second active layer 42 are exposed. In this regard, the photolithography process may be any suitable photolithography process.

That is, after coating a fourth photoresist film on the second insulating film 5, regions (e.g., predetermined regions) of the second insulating film 5 are exposed by irradiating light thereon through a third photo mask and developing the fourth photoresist film. After etching the exposed second insulating film 5, remaining portions of the fourth photoresist film are removed. Thus, the second insulating film 5 having a fourth pattern as shown in FIG. 9 is obtained.

Figure 10:
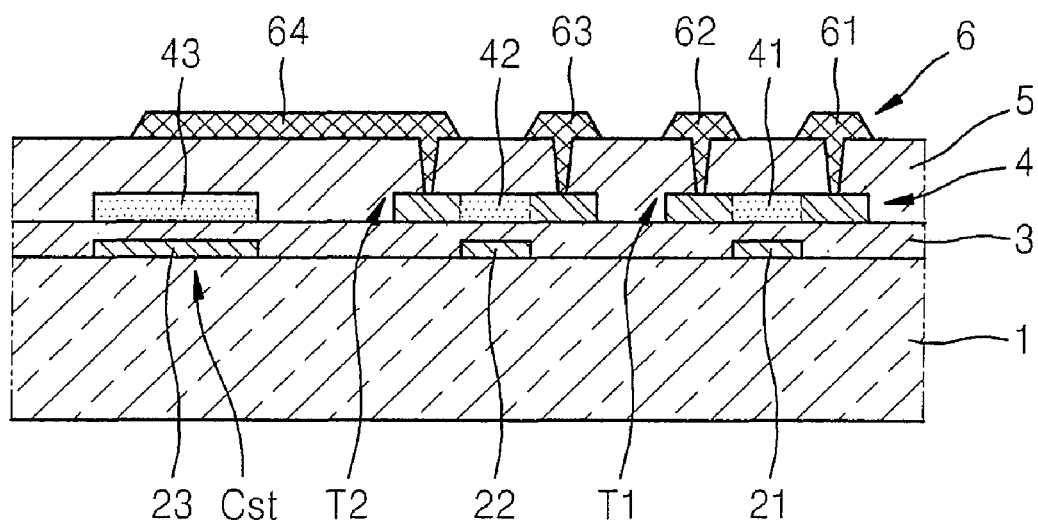
FIG. 10 is a schematic cross-sectional view of a patterned second insulating film formed on the second insulating film of FIG. 9.

Next, after coating a second conductive film 6 on the second insulating film 5, as shown in FIG. 10, a fifth pattern is formed by patterning the second conductive film 6. The fifth pattern of the second conductive film 6 may be formed using any suitable photolithography process.

That is, first, after coating the second conductive film 6 on the second insulating film 5, a fifth photoresist film is coated on the second conductive film. Regions (e.g., predetermined regions) of the second conductive film 6 are exposed by irradiating light thereon through a fourth photo mask and developing the fifth photoresist film. After etching the second conductive film 6, remaining portions of the fifth photoresist film are removed, and thus, the second conductive film 6 as shown in FIG. 10 is obtained.

The fifth pattern of the second conductive film 6 includes a first source electrode 61 and a first drain electrode 62, which are coupled (e.g., conductively coupled) to the first active layer 41, and a second source electrode 63 and a second drain electrode 64, which are coupled (e.g., conductively coupled) to the second active layer 42. According to another embodiment, the first and second source electrodes 61 and 63 are drain electrodes, and the first and second drain electrodes 62 and 64 are source electrodes.

In the above structure, the first gate electrode 21, the first active layer 41, the first source electrode 61, and the first drain electrode 62 constitute a first thin-film transistor T1, and the second gate electrode 22, the second active layer 42, the second source electrode 63, and the second drain electrode 64 constitute a second thin-film transistor T2.

In an exemplary embodiment, both the first and second thin-film transistors T1 and T2 are PMOS transistors.

Also, the second thin-film transistor T2 is a pixel-driving thin-film transistor and the second drain electrode 64 functions as a pixel electrode. Hereinafter, the reference numeral 64 is used to indicate both the second drain electrode and the pixel electrode.

As described above, the second conductive film 6 that forms the first source electrode 61, the first drain electrode 62, the second source electrode 63, and the second drain electrode 64 may be formed of a suitable material used to form a pixel electrode.

When the pixel electrode 64 is used as an anode electrode of an organic light emitting display device, the pixel electrode 64 may include a layer formed of a metal oxide having a high work function (absolute value), such as indium tin oxide (ITO), indium zinc oxide (IZO), and/or zinc oxide (ZnO). Also, in some embodiments, if the organic light emitting display device has a structure in which an image is projected in a direction toward an upper side of the organic light emitting display device, that is, in a direction opposite to (or facing oppositely away from) the substrate 1, the organic light emitting display device further includes a reflection film formed of an alloy of, for example, Al and Ag. Also, in some embodiments, the pixel electrode 64 is used as a cathode electrode of the organic light emitting display device, the pixel electrode 66 is formed of a highly conductive metal having a low work function (absolute value), such as Al, Ag, and/or Mg. In this case, the reflection film described above is unnecessary.

An active matrix substrate according to an exemplary embodiment of the present invention is formed using the process described above. As described above, in manufacturing the active matrix substrate, only four photo masks for patterning are used. Accordingly, the number of processes can be reduced, thereby increasing productivity, and thus, reducing manufacturing costs.

Figure 11:
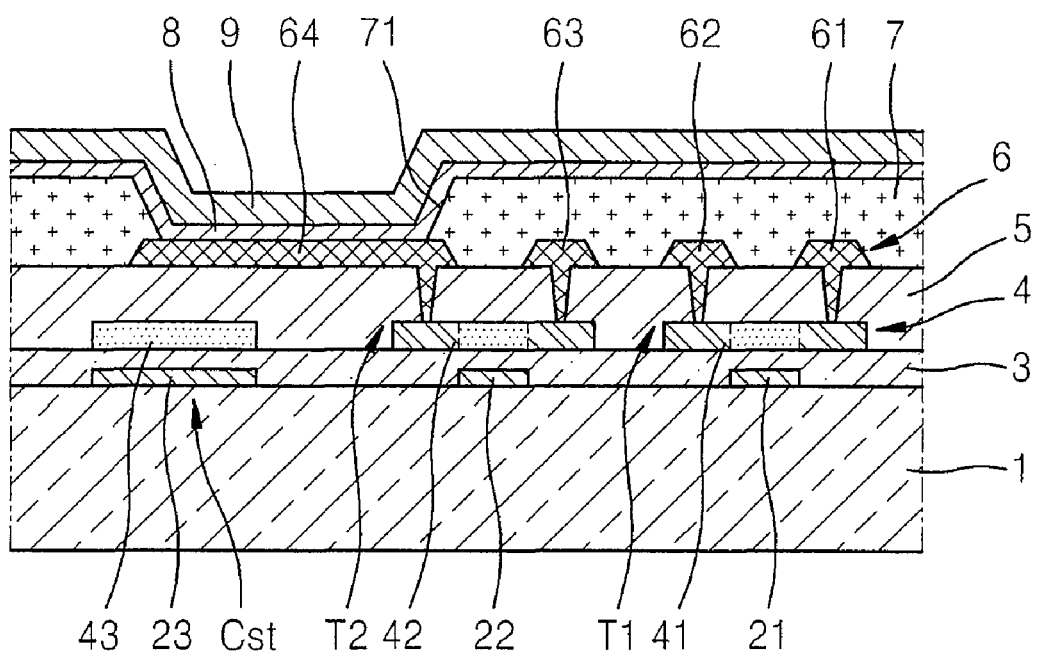
FIG. 11 is a schematic cross-sectional view of a third insulating film, an organic film, and a facing electrode, which are sequentially formed on the second insulating film of FIG. 10.

Referring to FIG. 11, after manufacturing the active matrix substrate having a pattern of the second conductive film 6, according to a further embodiment a third insulating film 7 is formed on the second conductive film 6 having the fifth pattern. The third conductive film 7 is patterned to form an opening 71 that exposes at least a portion of the pixel electrode 64 using any suitable photolithography process.

That is, after coating the third insulating film 7 on the second conductive film 6, a sixth photoresist film is coated on the third insulating film 7. Next, a region (e.g., a predetermined region corresponding to the opening 71) of the third insulating film 7 is exposed by irradiating light thereon through a fifth photo mask and developing the sixth photoresist film. After etching the exposed third insulating film 7, the remaining sixth photoresist film is removed, and thus, the third insulating film 7 having a sixth pattern as shown in FIG. 11 is obtained.

Next, an organic film 8 is deposited on the third insulating film 7. The organic film 8 may include a light emitting layer that can emit different colors in each pixel, and the light emitting layer is formed only on the pixel electrode 64 exposed through the opening 71.

In some embodiments, the organic film 8 that includes the light emitting layer is formed of a material commonly used to form any suitable organic light emitting display devices, and includes at least one common layer selected from functional layers such as a hole transport layer (HTL), a hole injection layer (HIL), an electron transport layer (ETL), and/or an electron injection layer (EIL). Here, the at least one common layer refers to a layer that is formed over the entire pixels.

After forming the organic film 8, a facing electrode 9 is formed on the organic film 8. During operation, a voltage having an opposite polarity to a voltage applied to the pixel electrode 64 is applied to the facing electrode 9. That is, if the pixel electrode 64 is an anode electrode, the facing electrode 9 is a cathode electrode, and vice versa.

If the organic light emitting display device is a top emission type in which an image emitted from the organic film 8 is projected in a direction toward the facing electrode 9, the facing electrode 9 is formed to have high optical transmittance, and if the organic light emitting display device is a bottom emission type in which an image is projected in a direction toward the substrate 1, the facing electrode 9 is formed to have high optical reflectance.

In manufacturing an organic light emitting display device according to an exemplary embodiment of the current invention, an active matrix substrate, which is a base substrate, is simply patterned using a reduced number of photo masks, thereby reducing manufacturing costs and increasing productivity.

Also, a semiconductor layer of a thin-film transistor is formed of a mono-crystalline semiconductor material, and thus, a circuit having further improved characteristics can be realized.

While the present invention has been described in connection with certain exemplary embodiments, it is to be understood that the invention is not limited to the disclosed embodiments, but, on the contrary, is intended to cover various modifications and equivalent arrangements included within the spirit and scope of the amended claims, and equivalents thereof.

What is claimed is:

1. A method of manufacturing an active matrix substrate, the method comprising:
   forming a first electrode having a first pattern on a substrate;
   forming a first insulating film to cover the first electrode on the substrate;
   attaching a first layer on a surface of a semiconductor wafer to the first insulating film by placing the semiconductor wafer on the first insulating film;
   transferring the first layer onto the first insulating film to form a semiconductor layer on the first insulating film by electrolysis method;
   doping a portion of the semiconductor layer with a dopant and patterning the semiconductor layer to form an active layer;
   forming a second insulating film to cover the active layer on the first insulating film; and
   forming a second electrode coupled to the doped region of the active layer on the second insulating film.

2. The method of claim 1, wherein the attaching of the first layer on the surface of the semiconductor wafer to the first insulating film comprises:
   forming the first layer on the surface of the semiconductor wafer;
   heating the semiconductor wafer with a first temperature and the first insulating film with a second temperature different from the first temperature;
   bringing the first layer on the surface of the semiconductor wafer into contact with the first insulating film;
   applying a voltage between the semiconductor wafer and the first insulating film; and
   peeling a portion of the semiconductor wafer from the first insulating film such that the first layer remains attached to the first insulating film.

3. The method of claim 2, wherein the forming of the first layer on the surface of the semiconductor wafer comprises ion implanting a gas comprising hydrogen ions into a surface of the semiconductor wafer.

4. The method of claim 1, wherein the semiconductor wafer comprises mono-crystalline silicon.

5. The method of claim 1, wherein the doping of the portion of the semiconductor layer with the dopant and patterning of the semiconductor layer to form the active layer comprises:
   forming a first resist layer on the semiconductor layer to cover a first portion of the semiconductor layer and to expose a first region of the semiconductor layer through an opening in the first resist layer;
   doping the first region of the semiconductor layer with a dopant through the opening in the first resist layer;
   removing the first resist layer; and
   patterning the semiconductor layer into a second pattern to form the active layer.

6. The method of claim 5, wherein a pattern of the opening in the first resist layer is substantially identical to a pattern in which portions other than portions of the first resist layer corresponding to the first pattern of the first electrode are etched.

7. The method of claim 6, wherein the forming of the first resist layer comprises:
   exposing the first resist layer to light from a lower side of the substrate in accordance with the pattern of the first electrode; and
   etching the first resist layer so as to maintain portions of the first resist layer substantially corresponding in position to the first pattern of the first electrode.

8. The method of claim 5, wherein the patterning of the semiconductor layer into the second pattern is performed prior to the forming of the first resist layer.

9. A method of manufacturing an organic light emitting display device, the method comprising:
   forming a first gate electrode and a second gate electrode on a substrate;
   forming a first insulating film to cover the first and second gate electrodes on the substrate;
   attaching a first layer on a surface of a semiconductor wafer to the first insulating film by placing the semiconductor wafer on the first insulating film;
   transferring the first layer onto the first insulating film to form a semiconductor layer on the first insulating film by electrolysis method;
   doping the first and second regions of the semiconductor layer and patterning the semiconductor layer to form a first active layer having a first region and a second active layer having a second region, wherein at least the first region and the second region are doped with a same type of dopant;
   forming a second insulating film to cover the first and second active layers on the first insulating film;
   forming holes in the second insulating film to expose the first and second regions of the semiconductor layer;
   forming a second electrode coupled to the first region and the second region and forming a pixel electrode coupled to the second region on the second insulating film;
   forming a third insulating film to cover the second electrode and the pixel electrode on the second insulating film;
   forming an opening in the third insulating film to expose at least one portion of the pixel electrode;
   forming an organic film comprising a light emitting layer on the at least one portion of the pixel electrode exposed through the opening in the third insulating film; and
   forming a facing electrode to cover the organic film.

10. The method of claim 9, wherein the attaching of the first layer on the surface of the semiconductor wafer to the first insulating film comprises:
   forming the first layer on the surface of the semiconductor wafer;
   heating the semiconductor wafer with a first temperature and the first insulating film with a second temperature different from the first temperature;
   bringing the first layer on the surface of the semiconductor wafer into contact with the first insulating film;
   applying a voltage between the semiconductor wafer and the first insulating film; and
   peeling a portion of the semiconductor wafer from the first insulating film such that the first layer remains attached to the first insulating film.

11. The method of claim 10, wherein the forming of the first layer comprises ion implanting a gas comprising hydrogen ions into a surface of the semiconductor wafer.

12. The method of claim 9, wherein the semiconductor wafer comprises mono-crystalline silicon.

13. The method of claim 9, wherein the forming of the first and second active layers comprises:
   forming a first resist layer on the semiconductor layer to cover the semiconductor layer and having an opening to expose the first region and the second region of the semiconductor layer;
   doping the first region and the second region of the semiconductor layer with a dopant through the opening of the first resist layer;
   removing the first resist layer; and
   patterning the semiconductor layer into a second pattern to form the first and second active layers.

14. The method of claim 13, wherein the pattern of the opening in the first resist layer is substantially identical to a pattern in which portions other than portions of the first resist layer corresponding to the pattern of the first electrode are etched.

15. The method of claim 14, wherein the forming of the first resist layer comprises:
   exposing the first resist layer to light from a lower side of the substrate in accordance with a pattern of the first gate electrode and the second gate electrode; and
   etching the first resist layer so as to maintain portions of the first resist layer to substantially correspond in position to the pattern of first gate electrode and the second gate electrode.

16. The method of claim 13, wherein the patterning of the semiconductor layer into the second pattern is performed prior to the forming of the first resist layer.

* * * * *